Figure 1:
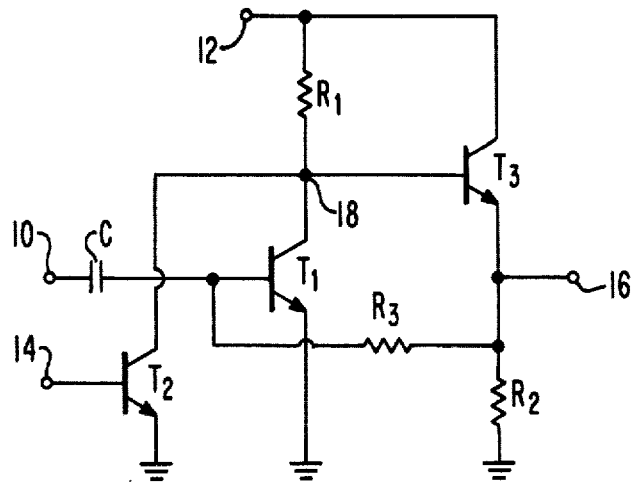

United States Patent [19]

Leidich

[11] 4,305,044

[45] Dec. 8, 1981

[54] AMPLIFIER CIRCUIT HAVING CONTROLLABLE GAIN

[75] Inventor: Arthur J. Leidich, Flemington, N.J.

[73] Assignee: RCA Corporation, New York, N.Y.

[21] Appl. No.: 81,087

[22] Filed: Oct. 1, 1979

[51] Int. Cl.³ .......................... H03G 3/18; H03G 3/30
[52] U.S. Cl. ..................................... 330/278; 330/285
[58] Field of Search ........................ 330/278, 285, 279

[56] References Cited

U.S. PATENT DOCUMENTS

| | | | |
|---|---|---|---|
| 3,651,420 | 3/1972 | Giontzeneli | 330/285 |
| 3,365,673 | 1/1968 | Barditch et al. | |
| 3,430,155 | 2/1969 | Harwood. | |
| 3,491,306 | 1/1970 | Nielsen. | |
| 3,651,420 | 3/1972 | Giontzeneli | 330/285 |
| 3,691,465 | 9/1972 | McFadyen. | |
| 3,942,129 | 3/1976 | Hall. | |
| 3,970,949 | 7/1976 | Higuchi. | |

FOREIGN PATENT DOCUMENTS 45-5804  2/1970  Japan .................................. 330/278

OTHER REFERENCES

Camenzind et al, "An outline of Design Techniques for Linear Integrated Circuits," *IEEE Journal of Solid State Circuits*, Vol. SC-4, No. 3, June 1969, pp. 110-121.

*Primary Examiner*—Davis L. Willis
*Assistant Examiner*—T. N. Grigsby
*Attorney, Agent, or Firm*—Eugene M. Whitacre; Paul J. Rasmussen; Clement A. Berard, Jr.

[57] ABSTRACT

An amplifier circuit, having voltage gain responsive to a control signal, includes a transistor stage having a transistor and a load, and an amplifier stage in cascade connection, and a control transistor connected to the transistor. The control signal varies the collector current of the transistor via the control transistor whereby the voltage gain of the transistor stage correspondingly varies. Degenerative feedback couples the output to the input for stabilizing the quiescent output potential so that the amplifier circuit is susceptible of being direct coupled to subsequent circuits.

21 Claims, 4 Drawing Figures

AMPLIFIER CIRCUIT HAVING CONTROLLABLE GAIN

The Government has rights in this invention pursuant to Martin-Marietta Corp. purchase order #2GD-692020 with RCA Corp. under prime Contract No. DAAA09-76-C-2001 awarded by the Department of the Army.

This invention relates to amplifier circuits having electrically controllable voltage gain and, in particular, to such amplifiers having stabilized, direct-current output potentials making them susceptible to direct coupling to subsequent stages.

Adjustment of amplifier gain is achieved by the variation of the effective value of at least one circuit element which is determinative of gain, for example, the transconductance of a transistor Conventional techniques for varying effective component values include transistors connected in parallel with a fixed resistor to vary the effective resistance thereof, or a voltage divider having an active element and a resistor to obtain a division ratio responsive to the conduction characteristics of the active element. Such variable networks, conventionally employed in the emitter, base, or collector circuits of transistor amplifiers, tend to disturb the quiescent bias of the amplier as well as varying its gain.

Alternatively, the bias condition of an active amplifier element may be varied in response to a gain control signal so that a gain influencing parameter of that transistor may be correspondingly varied. Such techniques conventionally give rise to wide fluctuations in the quiescent bias conditions of the amplifier necessitating alternating-current coupling to subsequent circuits.

The amplifier circuit of the present invention comprises a transistor stage, including a transistor and a load means, an amplifier in cascade connection therewith and current conductive means for varying the main current flow of the transistor. A degenerative feedback connection couples the output of the amplifier circuit to its input for controlling its quiescent operating point, thereby overcoming the disadvantages experienced with conventional gain-controlled amplifier circuits.

IN THE DRAWINGS:

FIGS. 1, 2 3 and 4 are schematic diagrams of amplifier circuits embodying the invention.

In FIG. 1, common-emitter amplifier transistor $T_1$ receives input signals from terminal 10 at its base electrode through capacitor C. Load resistor $R_1$ connects the collector of $T_1$ to a relatively positive supply voltage at terminal 12. Resistor $R_3$ supplies quiescent bias current to the base of $T_1$ as will be explained later.

The voltage gain of the common-emitter amplifier stage is given by $$A_v = g_m R_1 = [qI_Q/kT]R_1$$

where:
$g_m$ = transconductance of $T_1$,
q = charge of an electron,
k = Boltzmann's constant,
T = absolute temperature (degrees Kelvin),
$I_Q$ = the value of quiescent current flowing in the collector-emitter conduction path of $T_1$, and
$R_1$ = the collector load resistance of $T_1$.

The equation shows that the gain is directly proportional to the quiescent collector-to-emitter current flowing in $T_1$.

Control transistor $T_2$ conducts a portion of the current flowing through load means $R_1$ through its collector-to-emitter conduction path in response to a control signal applied to its base via terminal 14. Application of a control signal tending to increase the conduction of current by $T_2$ from node 18 causes a corresponding decrease in the collector-to-emitter current of $T_1$, thereby effecting a reduction in the voltage gain exhibited by $T_1$. Conversely, a control signal tending to decrease conduction in $T_2$ increases the voltage gain of $T_1$. Thus, transistor $T_2$ provides current conductive means for controlling the voltage gain of the common-emitter amplifier stage.

Transistor $R_3$ is an emitter-follower amplifier stage having an input connection at its base to which the collector of transistor $T_1$ connects, and an output connection at its emitter which connects to output 16. The emitter of $T_3$ connects through a current conductive connection, shown by way of example as resistor $R_2$, to a further point of operating potential, shown by way of example as the reference potential, ground.

Resistor $R_3$ completes a degenerative feedback connection between the non-inverting amplifier output 16 and the common-emitter amplifier input connection at the base of $T_1$. This connection provides voltage feedback for biasing transistors $T_1$ and $T_3$ for conduction and for stabilizing quiescent bias potential as follows: quiescent potential at the base of $T_1$ is established relative to the reference potential (ground) by the base-emitter forward conduction drop of $T_1$. That potential also exists at output 16 because the potential across resistor $R_3$, due to the base current demand of $T_1$, is small as compared to the base-emitter conduction drop of $T_1$. Similarly, the potential at the collector of $T_1$ is offset from the potential at output 16 towards the potential at supply terminal 12 by the emitter-to-base offset potential of $T_3$.

Operation of the degenerative feedback loop for stabilizing the quiescent potential at output 16 is as follows. Assume that the value of the control signal applied at terminal 14 is increased causing $T_2$ to conduct additional current away from node 18. Assuming the current in $T_1$ to be substantially independent of the control signal directly, the total current drawn through $R_1$ thus tends to increase causing the potential drop across $R_1$ to increase, in turn tending to reduce the potential at the base of $T_3$. That tendency towards decreasing potential is coupled through the base-emitter of $T_3$ to output 16 and thence through resistor $R_3$ to the base of $T_1$. Decreasing the base-emitter potential of $T_1$ causes a corresponding tendency for decrease in its collector current tending to permit the potential at its collector to rise towards the potential at supply 12. That tendency is opposite in polarity sense to the tendency created directly by the control signal operating through $T_2$. At balance, the decrease in $T_1$ collector current is substantially equal to the increase in $T_2$ collector current therfore the collector potential of $T_1$ and the quiescent potential at output 16 correspondingly maintain substantially their original quiescent values. The response of the degenerative feedback loop to a decreasing control signal is similar to that with an increasing control signal except that the polarity senses of the responses are reversed.

Thus, transistors $T_1$ and $T_2$ taken together form a common-emitter amplifier whose gain may be varied by an electrical control signal, while transistors $T_1$ and $T_3$ taken together form an amplifier whose output quiescent potential is voltage stabilized by the operation of a degenerative voltage feedback connection. The circuit in toto comprises an amplifier having voltage gain responsive to an electrical control signal and whose quiescent output potential is substantally independent of that gain control signal. Such amplifiers are particularly advantageous because gain is adjustable over a wide range with substantially no variation of the quiescent bias voltages thereby providing a more efficient use of transistors to reduce cost and complexity, and increase reliability.

Figure 2:
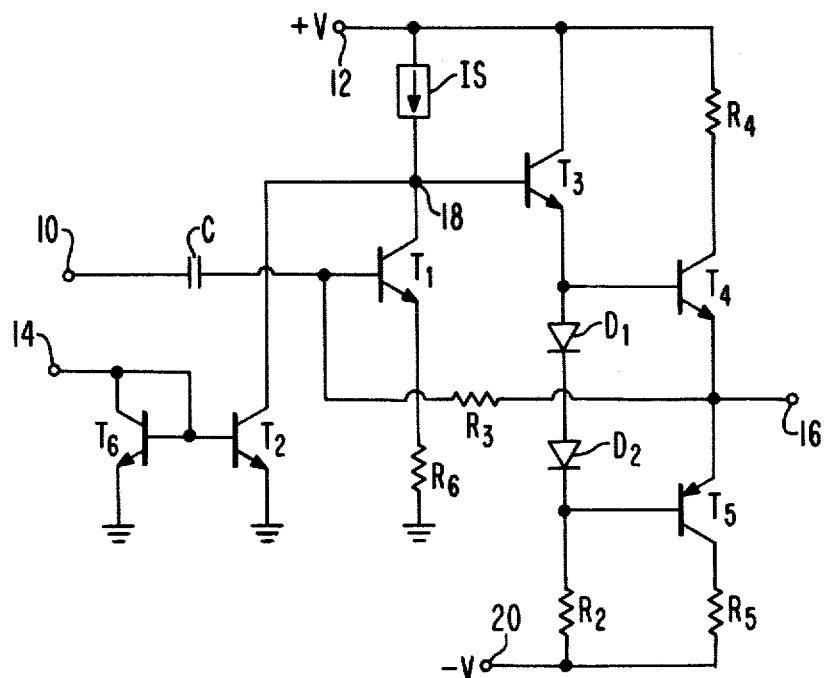

In FIG. 2, common-emitter amplifier transistor $T_1$ and current-conductive control transistor $T_2$ function substantially as described above for FIG. 1. The collector load for $T_1$ is shown, by way of example, as current generator IS. Resistor $R_6$ in the emitter circuit of $T_1$ improves gain control linearity, restricts the control range, and tends to limit the growth of noise signals in the circuit under high-gain conditions.

The control signal at terminal 14 is applied to the base of transistor $T_2$ in the voltage gain control circuit by way of a diode, shown by way of example as diode-connected transistor $T_6$. $T_6$ and $T_2$ thus connected form a current-mirror amplifier susceptible to receiving control signals in the form of control currents.

The non-inverting amplifier of FIG. 2 comprises transistors $T_4$ and $T_5$ connected to form a push-pull amplifier in cascade connection after emitter-follower transistor $T_3$. Signals from the collector of $T_1$ are applied to the input of the non-inverting amplifier at the base of $T_3$ which operates as an emitter-follower driving the base of $T_4$. The emitter of $T_3$ is returned to a relatively negative operating potential at supply terminal 20 by current supply means including resistor $R_2$ and diodes $D_1$ and $D_2$.

Complementary transistors $T_4$ and $T_5$ form a push-pull amplifier having input connections at their respective bases and an output connection 16 at the common connection of their emitters. Diodes $D_1$ and $D_2$ provide an offsetting potential of like polarity to the forward conduction potentials of $T_4$ and $T_5$ tending to establish conduction therein. The collector of $T_4$ connects to a relatively positive supply potential at terminal 12, shown by way of example through resistor $R_4$. Similarly, the collector of $T_5$ connects to relatively negative supply terminal 20 through resistor $R_5$. The voltage feedback connection between output 16 and the base of $T_1$ is provided by a current conductive connection, for example, resistor $R_3$.

The operation of the amplifier of FIG. 2 is substantially similar to that of the amplifier of FIG. 1 as is the operation of the degenerative voltage feedback connection for stabilizing quiescent bias potentials. In a typical circuit, the value of $R_6$ is preselected so that the voltage drop thereacross is small as compared to the base-emitter potential of $T_1$. The quiescent potential at output 16 is substantially equal to the base potential of $T_1$ rendering the amplifier susceptible for direct current coupling to subsequent circuits. The quiescent potential at the collector of $T_1$ in the circuit of FIG. 2 however, is at a potential offset in the direction of the voltage at supply 12 by the base-emitter potentials of transistors $T_3$ and $T_4$.

Thus, where the forward-bias conduction potential of the base-emitter junction of a transistor is represented by $V_{BE}$, output 16 has a quiescent operating potential of $1V_{BE}$ relative to the reference potential (ground) in the circuits of both FIGS. 1 and 2, while the collector of $T_1$ has a quiescent potential of $2V_{BE}$ in FIG. 1, and the collector of $T_1$ has a quiescent potential of $3V_{BE}$ in the circuit of FIG. 2.

Figure 3:
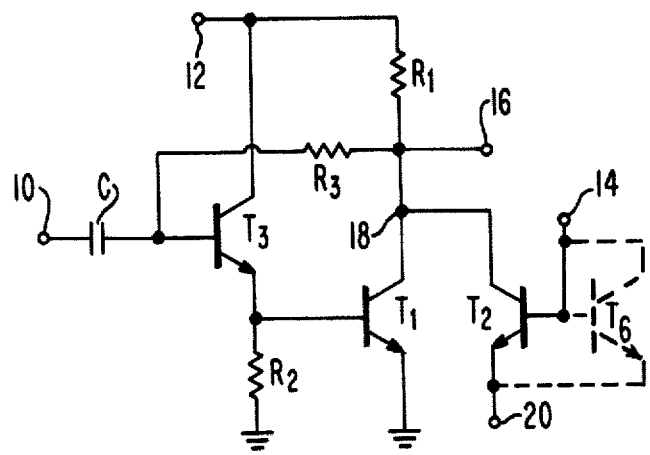

The amplifier of FIG. 3 is similar to that of FIG. 1 except that the order in which amplifier stages including $T_1$ and $T_3$ are cascaded is reversed. In operation, input signals from terminal 10 couple to emitter-follower amplifier stage $T_3$ and thence to common-emitter stage $T_1$. Output signals are available at terminal 16 from the collector of $T_1$.

Control transistor $T_2$ connects to node 18 for conducting, in response to the signal at 14, a portion of the current in load $R_1$ that flows through the main-conduction path of $T_1$. The emitter of $T_2$ connects, by way of example, to relatively negative supply 20.

Direct-coupled degenerative feedback through $R_3$ couples the output of amplifier stage $T_1$ to the input of stage $T_3$, at its base. Operation of that feedback loop is analogous to the description thereof for FIG. 1 hereinabove. Output 16 is controlled thereby to a quiescent potential of $2V_{BE}$.

Figure 4:
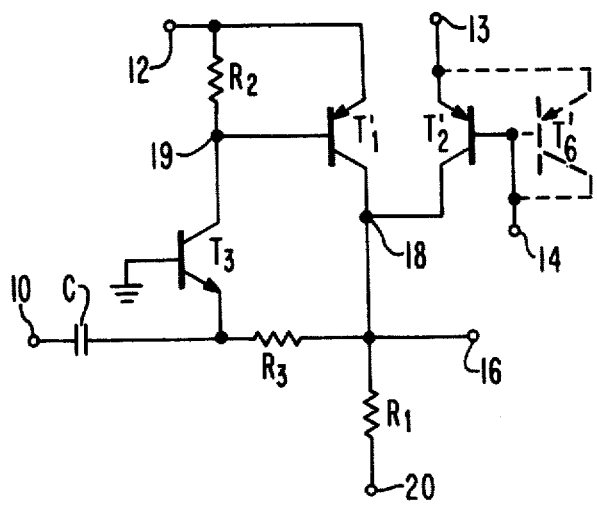

FIG. 4 is a further alternative embodiment of the present invention wherein the first stage includes NPN transistor $T_3$ in common-base configuration and the cascade stage includes PNP transistor $T_1'$ in common-emitter configuration.

In operation, input signals from terminal 10 couple to the emitter input to $T_3$ and to load means $R_2$ connected in its main-conduction path. Signals therefrom coupled to common-emitter transistor $T_1'$ stage and thence to output 16. Load means $R_1$ couples the main-conduction path of $T_1'$ to relatively negative supply 20.

PNP control transistor $RT_2'$ controls the gain of the $T_1'$ stage in response to signals at terminal 14 by controlling the portion of the current flow through load means $R_1$ that flows in the collector-emitter path of $T_1'$. $T_2'$ is shown, by way of example, as connecting to relatively positive supply terminal 13.

Degenerative feedback for stabilizing the output voltage at 16 is direct-coupled from the output of amplifier stage $T_1'$ at node 18 to the input amplifier stage at the emitter of $T_3$ by resistor $R_3$. Operation of that feedback loop is as follows. For example, increasing $T_2'$ collector current tends to increase the potential at node 18 which is coupled via $R_3$ to tend to reduce the base-emitter potential of $T_3$. That tendency reduces its collector current, increasing the potential at node 19, tending to reduce the base-emitter potential of $T_1'$ and the collector-emitter current therethrough. At balance, the reduction of current in $T_1'$ is substantially equal to the current increase in $T_2'$ therefore the potential at node 18 tends to maintain its original quiescent value (i.e. $-1V_{BE}$ in FIG. 4).

While the description and figures herein describe preferred alternative embodiments incorporating the present invention, one skilled in the art of design when armed with the teachings of this disclosure would be able to envision further embodiments without departing from the spirit of the invention. Control transistor $T_2$ may be connected for supplying current so that the main current flow in $T_1$ is greater than the current flow in load means $R_1$; for example, in FIGS. 1, 2 or 3 $T_2$ could be a PNP transistor having its collector connecting to node 18 and its emitter connecting to supply 12.

For example, a control transistor could be connected at its collector to node 19 in FIG. 4 for controlling the quiescent collector current of common-base transistor $T_3$ and thereby controlling its gain. Alternative types of transistors may be substituted for the bipolar transistors shown; for example, control transistor T2 could be a field-effect transistor or amplifier T3 could be a field-effect transistor source-follower.

By way of further example, diode-connected transistors T6 and T6' can be connected to T2 and T2' of FIGS. 3 and 4, respectively, to form current mirror amplifiers for receiving control currents from terminal 14 in like manner to that described above in connection with FIG. 2.

What is claimed is:

1. An amplifier circuit having controllable gain comprising:
    a transistor stage having input and output connections and including load means coupled in its main current-conduction path;
    current conductive means responsive to a control signal, coupled to the main current-conduction path of said transistor stage for conducting a current flow for varying the quiescent main current flow of said transistor stage with respect to the quiescent current flow of said load means;
    amplifing means having an input connection and having an output connection;
    an input terminal and an output terminal;
    means for coupling said input terminal to the input connection of one of said transistor stage and said amplifying means, for coupling the output connection of the other of said transistor stage and said amplifying means to said output terminal, and for coupling the output connection of said one to the input connection of said other; and
    means completing a fixed degenerative feedback connection for coupling a predetermined proportion unaffected by said control signal of the potential at said output terminal to said input terminal to control the quiescent operating potential at said output terminal.

2. An amplifier circuit according to claim 1 wherein said transistor stage comprises:
    a transistor having input and output electrodes and having a common electrode coupled to a point of reference potential;
    means for applying an input signal to the input electrode of said transistor; and
    wherein said load means couples the output electrode of said transistor to a point of operating potential.

3. An amplifier circuit according to claim 1 wherein said transistor stage comprises:
    a transistor having output and common electrodes and having an input electrode coupled to a point of reference potential;
    means for applying an input signal to the common electrode of said transistor; and
    wherein said load means couples the output electrode of said transistor to a point of operating potential.

4. An amplifier circuit according to any of claims 1, 2 or 3 wherein said amplifying means comprises:
    non-invering amplifying means including:
    an amplifier transistor having an input electrode to which said input connection connects, having a common electrode, and having an output electrode;
    means for connecting the output electrode of said amplifier transistor to said point of operating potential;
    means for connecting the common electrode of said amplifier transistor to said output connection; and
    further current conductive means for connecting the common electrode of said amplifier transistor to a further point of operating potential.

5. An amplifier circuit according to claim 4 wherein said further current conductive means includes resistance means, and the potential of said further point of operating potential is said reference potential.

6. An amplifier as set forth in claim 4 wherein:
    said means for connecting the common electrode of said amplifier transistor and said further current conductive means together include:
    a first further amplifier transistor of like conductivity type to said amplifier transistor, having an input electrode to which the common electrode of said amplifier transistor connects, having an output electrode connected to said point of operating potential, and having a common electrode connected to said output connection;
    a second further amplifier transistor of conductivity type complementary to that of said amplifier transistor, having an input electrode, having an output electrode connected to said further point of operating potential, and having a common electrode connected to said output connection;
    offset potential generating means connected between the respective input electrodes of said first and second further amplifier transistors, which offset potential is of like polarity to the forward-bias conduction potentials of the input-common junctions of said first and second further amplifier transistors; and
    resistance means for connecting the input electrode of said second further amplifier transistor to said further point of operating potential.

7. An amplifier as set forth in claim 6 wherein said offset potential generating means includes first and second diode means in series connection and poled for concurrent conduction.

8. An amplifier circuit according to claim 3 wherein said amplifying means comprises:
    an amplifier transistor of conductivity type complementary to that of said transistor, having an input electrode to which said input connection connects, having an output electrode coupled to said output connection, and having a common electrode coupled to said point of operating potential; and
    further load means for coupling the output electrode of said amplifier transistor to a further point of operating potential.

9. An amplifier circuit according to any of claims 1, 2, 3 or 8 wherein said current conductive means comprises:
    a control transistor having an output electrode connected to the output electrode of said transistor, having a common electrode connected to a further point of reference potential, and having an input electrode; and
    means for applying said control signal to the input electrode of said control transistor.

10. An amplifier circuit according to claim 9, wherein said means for applying comprises:
    diode means connected between the input and common electrodes of said control transistor, which diode means is poled for forward conduction in the same polarity sense as the input-to-common junction of said control transistor.

11. An amplifier circuit according to any of claims 2, 3 or 8 wherein said fixed degenerative feedback connection comprises direct-current conductive means for coupling the output connection of said amplifying means to said means for applying an input signal.

12. An amplifier circuit according to claim 11 wherein said direct current conductive means is resistance means.

13. An amplifier circuit having controllable gain comprising:
   a transistor stage including load means coupled in its main current-conduction path;
   current conductive means responsive to a control signal, coupled to the main current-conduction path of said transistor stage for conducting a current flow for varying the quiescent main current flow of said transistor stage with respect to the quiescent current flow of said load means;
   amplifying means having an input connection coupled for receiving input signals and having an output connection coupled to said transistor stage; and
   means for completing a fixed degenerative feedback connection from said transistor stage to the input connection of said amplifying means for controlling the quiescent operating point of said transistor stage.

14. An amplifier circuit according to claim 13 wherein said transistor stage comprises:
   a transistor having an input electrode to which said amplifying means couples, having an output electrode, and having a common electrode coupled to a point of operating potential; and
   wherein said load means couples the output electrode of said transistor to a further point of operating potential.

15. An amplifier circuit according to claim 14 wherein said amplifying means comprises:
   an amplifier transistor of complementary conductivity type to that of said transistor having an input electrode coupled to a point of reference potential, and having output and common electrodes;
   means for applying an input signal to the common electrode of said amplifier transistor; and
   further load means for coupling the output electrode of said amplifier transistor to said point of operating potential.

16. An amplifier circuit according to claim 14 wherein said amplifying means comprises:
   an amplifier transistor having an input electrode to which said input connection connects, having a common electrode, and having an output electrode;
   means for connecting the output electrode of said amplifier transistor to said further point of operating potential;
   means for connecting the common electrode of said amplifier transistor to said output connection; and
   further current conductive means for connecting the common electrode of said amplifier transistor to said point of operating potential.

17. An amplifier circuit according to claim 16 wherein said further current conductive means includes resistance means.

18. An amplifier circuit according to any of claims 14–17 wherein said current conductive means comprises:
   a control transistor having an output electrode connected to the output electrode of said transistor, having a common electrode connected to a further point of reference potential, and having an input electrode; and
   means for applying said control signal to the input electrode of said control transistor.

19. An amplifier circuit according to claim 18 wherein said means for applying comprises:
   diode means connected between the input and common electrodes of said control transistor, which diode means is poled for forward conduction in the same polarity sense as the input-to-common junction of said control transistor.

20. An amplifier circuit according to any of claims 14 through 17 wherein said means for completing a fixed degenerative feedback connection comprises direct-current conductive means for coupling the output electrode of said transistor to said input connection of said amplifying means.

21. An amplifier circuit according to claim 20 wherein said direct current conductive means is resistance means.

* * * * *